United States Patent
Zhang et al.

(10) Patent No.: US 10,236,361 B2
(45) Date of Patent: Mar. 19, 2019

(54) METHOD FOR FORMING MASK PATTERN, THIN FILM TRANSISTOR AND METHOD FOR FORMING THE SAME, AND DISPLAY DEVICE

(71) Applicant: BOE Technology Group Co., Ltd., Beijing (CN)

(72) Inventors: Bin Zhang, Beijing (CN); Tingting Zhou, Beijing (CN); Zhen Liu, Beijing (CN); Zhanfeng Cao, Beijing (CN); Shi Shu, Beijing (CN); Qi Yao, Beijing (CN); Feng Guan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 40 days.

(21) Appl. No.: 15/519,324

(22) PCT Filed: Sep. 1, 2016

(86) PCT No.: PCT/CN2016/097813
§ 371 (c)(1),
(2) Date: Apr. 14, 2017

(87) PCT Pub. No.: WO2017/118061
PCT Pub. Date: Jul. 13, 2017

(65) Prior Publication Data
US 2017/0365684 A1    Dec. 21, 2017

(30) Foreign Application Priority Data

Jan. 4, 2016 (CN) .......................... 2016 1 0004474

(51) Int. Cl.
*H01L 21/027*    (2006.01)
*G03F 7/20*    (2006.01)
(Continued)

(52) U.S. Cl.
CPC .......... *H01L 29/6675* (2013.01); *G03F 7/094* (2013.01); *G03F 7/16* (2013.01);
(Continued)

(58) Field of Classification Search
CPC ............... H01L 21/027; H01L 21/0273; H01L 21/0274; H01L 21/31144; H01L 27/1288;
(Continued)

(56) References Cited

U.S. PATENT DOCUMENTS 5,702,960 A    12/1997    Moon
6,670,104 B2    12/2003    Kido
(Continued)

FOREIGN PATENT DOCUMENTS

CN    1869809 A    11/2006
CN    103309165 A    9/2013
(Continued)

OTHER PUBLICATIONS

Nov. 13, 2017—(CN) First Office Action Appn 201610004474.2 with English Tran.
(Continued)

*Primary Examiner* — Michael M Trinh
(74) *Attorney, Agent, or Firm* — Banner & Witcoff, Ltd.

(57) ABSTRACT

A method for forming a mask pattern is provided, comprising forming a negative photoresist on a substrate; in an environment without oxygen, to performing a first exposure on the negative photoresist by use of a first ordinary mask plate, so that a fully-cured portion of the negative photoresist is exposed to light and a semi-cured portion and a removed portion of the negative photoresist are not exposed to light; in an environment with oxygen, performing a second exposure on the negative photoresist by use of a second ordinary mask plate, so that the semi-cured portion of the negative photoresist is exposed to light and the removed portion of
(Continued)

the negative photoresist not exposed to light; removing the uncured negative photoresist and forming the mask pattern.

17 Claims, 12 Drawing Sheets

(51) Int. Cl.
| | |
|---|---|
| *H01L 29/66* | (2006.01) |
| *H01L 29/786* | (2006.01) |
| *H01L 27/12* | (2006.01) |
| *G03F 7/16* | (2006.01) |
| *G03F 7/09* | (2006.01) |
| *G03F 7/40* | (2006.01) |

(52) U.S. Cl.
CPC ............... *G03F 7/20* (2013.01); *G03F 7/201* (2013.01); *G03F 7/203* (2013.01); *G03F 7/2022* (2013.01); *G03F 7/2026* (2013.01); *H01L 21/027* (2013.01); *H01L 21/0274* (2013.01); *H01L 27/12* (2013.01); *H01L 29/7869* (2013.01); *H01L 29/78621* (2013.01); *G03F 7/40* (2013.01)

(58) Field of Classification Search
CPC ........ G03F 7/201; G03F 7/203; G03F 7/2022; G03F 7/2024; G03F 7/2026; G03F 7/2041; G03F 7/2004; G03F 7/09; G03F 7/094; G03F 7/20
See application file for complete search history.

(56) References Cited

U.S. PATENT DOCUMENTS

| | | | | |
|---|---|---|---|---|
| 7,981,720 | B2* | 7/2011 | Kim | .................. H01L 21/02554 |
| | | | | 438/104 |
| 8,297,991 | B2* | 10/2012 | Adachi | .................. G03B 27/00 |
| | | | | 439/149 |
| 8,399,162 | B2* | 3/2013 | Hsieh | ........................ G03F 7/20 |
| | | | | 430/394 |
| 8,853,093 | B2* | 10/2014 | Hu | ........................ G03F 7/0035 |
| | | | | 257/E21.026 |
| 2008/0299690 | A1* | 12/2008 | Hirota | ............... G02F 1/133753 |
| | | | | 438/30 |
| 2014/0224419 | A1* | 8/2014 | Nystrom | ................. H01L 23/10 |
| | | | | 156/256 |

FOREIGN PATENT DOCUMENTS

| | | |
|---|---|---|
| CN | 104020882 A | 9/2014 |
| CN | 104218041 A | 12/2014 |
| CN | 105070650 A | 11/2015 |
| CN | 105575776 A | 5/2016 |

OTHER PUBLICATIONS

Dec. 2, 2016—(WO) International Search Report and Written Opinion Appn PCT/CN2016/097813 with English Tran.

* cited by examiner

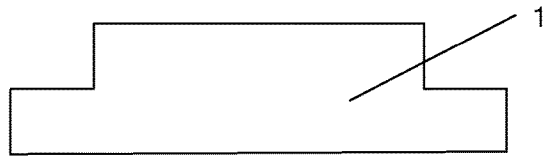

Fig. 1

Forming a negative photoresist on a substrate, wherein the negative photoresist has the following properties: if the negative photoresist is exposed in an environment without oxygen, the exposed portion can be cured, and if the negative photoresist is exposed in an environment with oxygen, a surface part of the exposed portion cannot be cured, while other part of the exposed portion than the surface part can be cured

↓

In an environment without oxygen, the negative photoresist is subjected to a first exposure by use of a first ordinary mask plate, so that a fully-cured portion of the negative photoresist is exposed to light and a semi-cured portion and a removed portion are not exposed to light

↓

In an environment with oxygen, the negative photoresist is subjected to a second exposure by use of a second ordinary mask plate, so that the semi-cured portion of the negative photoresist is exposed to light and the removed portion is not exposed to light

↓

Removing the uncured negative photoresist so as to form a mask pattern

Fig. 2

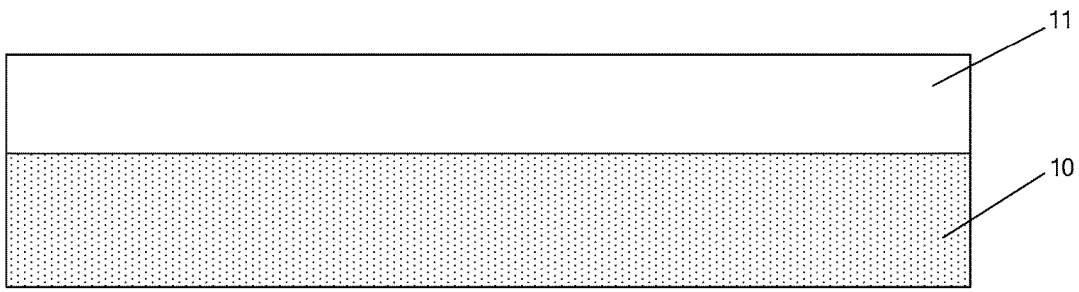

Fig. 3

METHOD FOR FORMING MASK PATTERN, THIN FILM TRANSISTOR AND METHOD FOR FORMING THE SAME, AND DISPLAY DEVICE

The application is a U.S. National Phase Entry of International Application No. PCT/CN2016/097813 filed on Sep. 1, 2016, designating the United States of America and claiming priority to Chinese Patent Application No. 201610004474.2 filed on Jan. 4, 2016. The present application claims priority to and the benefit of the above-identified applications and the above-identified applications are incorporated by reference herein in their entirety.

TECHNICAL FIELD

Embodiments of the present disclosure relate to a method for forming a mask pattern, a thin film transistor, a method for forming a thin film transistor, and a display device comprising the thin film transistor.

BACKGROUND

At present, film layers in a display device are mostly formed by a patterning process. The patterning process is a process for making a thin film into a layer comprising at least one pattern. The patterning process typically comprises forming a mask pattern on a thin film, etching a portion of the thin film which is not covered by the mask pattern, and then peeling off the remaining mask pattern, thereby obtaining a desired pattern of the thin film.

In the practical production, it is usually required to form a thin film pattern having a step. At this time, it is required to form a mask pattern 1 having a step as shown in FIG. 1. At present, the aforementioned mask pattern is always formed by a halftone mask plate. However, the process for manufacturing the halftone mask plate is relatively complex.

SUMMARY

At least one embodiment of the present disclosure provides a method for forming a mask pattern, comprising:

forming a negative photoresist on a substrate, the negative photoresist having the following properties: after the negative photoresist is exposed in an environment without oxygen, an exposed portion is cured; after the negative photoresist is exposed in an environment with oxygen, a surface part of an exposed portion is not cured, while other part of the exposed portion than the surface part is cured;

in an environment without oxygen, performing a first exposure on the negative photoresist by use of a first ordinary mask plate, so that a fully-cured portion of the negative photoresist is exposed to light and a semi-cured portion and a removed portion of the negative photoresist are not exposed to light;

in an environment with oxygen, performing a second exposure on the negative photoresist with s second ordinary mask plate, so that the semi-cured portion of the negative photoresist is exposed to light and the removed portion of the negative photoresist is not exposed to light; and removing the uncured negative photoresist so as to form the mask pattern.

In one embodiment of the present disclosure, the semi-cured portion of the negative photoresist is positioned between the fully-cured portion and the removed portion and is adjacent to the fully-cured portion.

In one embodiment of the present disclosure, the second ordinary mask plate and the first ordinary mask plate are the same ordinary mask plate;

in an environment with oxygen, performing a second exposure on the negative photoresist by use of a second ordinary mask, so that the semi-cured portion of the negative photoresist is exposed to light and the removed portion of the negative photoresist is not exposed to light comprises:

in an environment with oxygen, keeping corresponding positional relationship between the first ordinary mask plate and the negative photoresist and adjusting exposure parameters, performing the second exposure on the negative photoresist by use of the first ordinary mask plate so that the semi-cured portion of the negative photoresist is exposed to light and the removed portion of the negative photoresist is not exposed to light.

In one embodiment of the present disclosure, adjusting exposure parameters comprises:

one of adjusting an angle of light emitted from an exposure machine so as to increase a range of the negative photoresist being irradiated by the light, increasing an exposure amount, and increasing a distance between the mask plate and the substrate, and a combination thereof.

In one embodiment of the present disclosure, increasing an exposure amount comprising increasing exposure time and/or increasing illuminance of the exposure machine.

In one embodiment of the present disclosure, the environment without oxygen is a vacuum environment or an inert gas environment.

In one embodiment of the present disclosure, the semi-cured portion of the negative photoresist is positioned between the fully-cured portion and the removed portion and is adjacent to the fully-cured portion;

in an environment with oxygen, performing a second exposure on the negative photoresist by use of a second ordinary mask plate, so that the semi-cured portion of the negative photoresist is exposed to light and the removed portion of the negative photoresist is not exposed to light comprises:

in an environment with oxygen, performing a second exposure on the negative photoresist by use of second ordinary mask plate, so that the semi-cured portion of the negative photoresist is exposed to light and the removed portion of the negative photoresist is not exposed to light.

In one embodiment of the present disclosure, forming a negative photoresist on a substrate comprises: coating the negative photoresist on the substrate or forming the negative photoresist on the substrate by a transfer method.

Embodiments of the present disclosure provide a method for forming a mask pattern, in which the negative photoresist is subjected to the first exposure by use of the first ordinary mask plate in an environment without oxygen so that the fully-cured portion of the negative photoresist is exposed to light and the semi-cured portion and the removed portion are not exposed to light, and then the negative photoresist is subjected to the second exposure by use of the second ordinary mask plate in an environment with oxygen so that the semi-cured portion of the negative photoresist is exposed to light and the removed portion is not exposed to light, and finally the uncured negative photoresist is removed and thus the mask pattern is formed, by utilizing the properties of the negative photoresist, i.e., the negative photoresist can be properly cured if exposed in an environment without oxygen, while the surface part of the negative photoresist cannot be properly cured and other part of the exposed portion can be properly cured if exposed in an environment with oxygen. The mask pattern comprises a pattern formed by the fully-cured portion and a pattern formed by the semi-cured portion. The pattern formed by the semi-cured portion has a smaller thickness than the pattern formed by the fully-cured portion. The method for forming the mask pattern can form a mask pattern having a non-uniform thickness only by using an ordinary mask plate, thereby avoiding using a halftone mask plate.

At least one embodiment of the present disclosure provides a method for forming a thin film transistor, comprising:

successively forming a metal oxide layer and an etch stop layer on a substrate;

forming a mask pattern on the etch stop layer by use of the method mentioned above, wherein the mask pattern comprises a body portion and a step portion surrounding the body portion, and the body portion has a thickness greater than that of the step portion;

etching portions of the metal oxide layer and the etch stop layer which are not covered by the mask pattern;

ashing the mask pattern so as to remove the step portion and thin the body portion;

etching a portion of the etch stop layer which is not covered by the ashed mask pattern;

peeling off the remaining mask pattern so as to form a pattern of metal oxide layer and a pattern of etch stop layer.

In one embodiment of the present disclosure, material for the metal oxide layer is indium gallium zinc oxide, indium tin zinc oxide, zinc indium tin oxide or magnesium indium zinc oxide.

At least one embodiment of the present disclosure provides a method for forming a thin film transistor, comprising:

forming a polysilicon layer on a substrate;

forming a mask pattern on the polysilicon layer by use of the method for forming a mask pattern as mentioned above, wherein the mask pattern comprises a body portion and a step portion surrounding the body portion, and the body portion has a thickness greater than that of the step portion;

performing a first doping in a portion of the polysilicon layer which is not covered by the mask pattern;

ashing the mask pattern so as to remove the step portion and thin the body portion;

performing a second doping in a portion of the polysilicon layer which is not covered by the ashed mask pattern, wherein the portion of the doped polysilicon layer which is only subjected to the second doping has a lower impurity concentration than the portion which is subjected to doping twice; and peeling off the remained mask pattern so as to form a pattern of polysilicon layer.

In one embodiment of the present disclosure, before forming a polysilicon layer on a substrate, the method further comprises:

forming a buffer layer on the substrate, the buffer layer being positioned between the substrate and the polysilicon layer.

At least one embodiment of the present disclosure provides a thin film transistor, which is formed by use of any one of the method for forming a thin film transistor as mentioned above.

At least one embodiment of the present disclosure provides a display device, which comprises the thin film transistor as mentioned above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 1 shows a mask pattern having a step in the conventional arts;

FIG. 2 is an illustrative flow chart of a method for forming a mask pattern according to one embodiment of the present disclosure;

FIG. 3 is an illustrative view of a structure formed by forming a negative photoresist on a substrate in FIG. 2;

REFERENCE SIGNS

Figure 4:
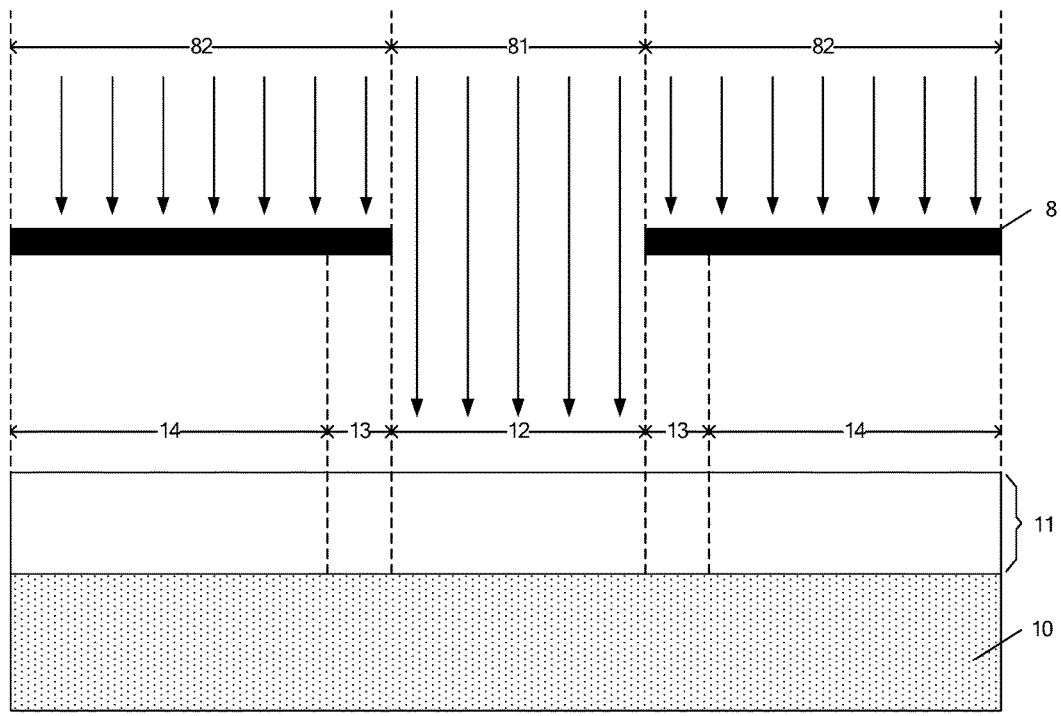
FIG. 4 is an illustrative view of a first exposure of a step S02 in FIG. 2.

1—mask pattern having a step;
101—step portion;
102—body portion;
8—first ordinary mask plate;
81—transparent part of the first ordinary mask plate;
82—opaque part of the first ordinary mask plate;
9—second ordinary mask plate;
91—transparent part of the second ordinary mask plate;
92—opaque part of the second ordinary mask plate;
10—substrate;
11—negative photoresist;
12—fully-cured portion of negative photoresist;
13—semi-cured portion of negative photoresist;
14—removed portion of negative photoresist;
15—metal oxide layer;
16—etch stop layer;
150—pattern of metal oxide layer;
160—pattern of etch stop layer;
17—polysilicon layer;
170—pattern of polysilicon layer;
18—buffer layer;
200—light.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In the description of the present disclosure, it is to be understood that the orientational or positional relationships indicated by the terms "upper", "lower", and etc. are based on orientational or positional relationships shown in the figures, which is only for purposes of describing the present disclosure and simplifying the description, rather than suggesting or implying that the relevant devices or elements must have a particular orientation relationship or must be constructed and operated in a particular orientation, and thus cannot be construed as limitations to the present disclosure.

In the embodiments of the present disclosure, an ordinary mask plate refers to a mask plate comprising a transparent part and an opaque part only, while a halftone mask plate refers to a mask plate comprising a transparent part, a semi-transparent part and an opaque part. The mask plates used in the embodiments are all ordinary mask plates.

Embodiment One

At least one embodiment of the present disclosure provides a method for forming a mask pattern. As illustrated in FIG. 2, the method comprises:

forming a negative photoresist 11 on a substrate 10, wherein the negative photoresist 11 has the following properties: if the negative photoresist 11 is exposed in an environment without oxygen, the exposed portion can be cured, and if the negative photoresist 11 is exposed in an environment with oxygen, a surface part of the exposed portion cannot be cured, while other part of the exposed portion than the surface part can be cured. The thus-formed structure is illustrated in FIG. 3.

The aforementioned negative photoresist is such that the exposed portion can be cured after exposure in an environment without oxygen, and a surface part of the exposed portion cannot be cured, while other part of the exposed portion than the surface part can be cured after exposure in an environment with oxygen. As an example, the negative photoresist can be directly obtained by removing the nano-silver on the surface of TCTF (nano-silver Transparent Conductive Transfer Film) with a product Model of MS100D3G4 manufactured by Hitachi Chemical Company.

The aforementioned substrate may be made of Corning glass, Asahi Glass, quartz glass or the like. The embodiments of the present disclosure are not limited thereto.

Referring to FIG. 4, in an environment without oxygen, the negative photoresist 11 as illustrated in FIG. 3 is subjected to a first exposure by use of a first ordinary mask plate 8, so that a fully-cured portion 12 of the negative photoresist 11 is exposed to light and a semi-cured portion 13 and a removed portion 14 are not exposed to light.

Figure 5:
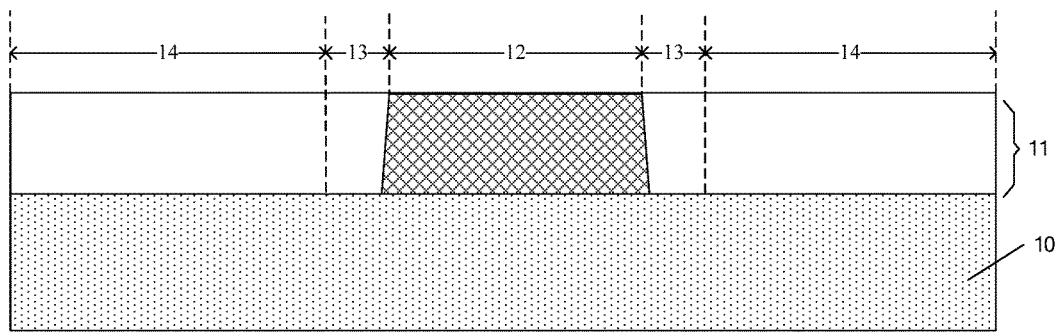
FIG. 5 is an illustrative view of the structure of FIG. 3 after the first exposure.

After the first exposure, a structure as illustrated in FIG. 5 can be obtained. It is to be noted that to facilitate discrimination, the shading portion in FIG. 5 indicates that the negative photoresist in the fully-cured portion 12 is cured after exposure and does not have any other meanings. In addition, due to the limitation of process accuracy, the fully-cured portion 12 is cured after exposure and has sides most of which are bevels instead of ideal vertical planes.

For example, as illustrated in FIG. 4, a transparent part 81 of the first ordinary mask plate 8 can be corresponding to the fully-cured portion 12 of the negative photoresist 11, and an opaque part 82 of the first ordinary mask plate 8 can be corresponding to the semi-cured portion 13 and the removed portion 14 of the negative photoresist 11. Thus, when the ultraviolet light is irradiated onto the first ordinary mask plate 8, the opaque part 82 can block the ultraviolet light from being irradiated onto the semi-cured portion 13 and the removed portion 14, so that the fully-cured portion 12 of the negative photoresist 11 is subjected to exposure, while the semi-cured portion 13 and the removed portion 14 are not subjected to exposure.

Figure 6:
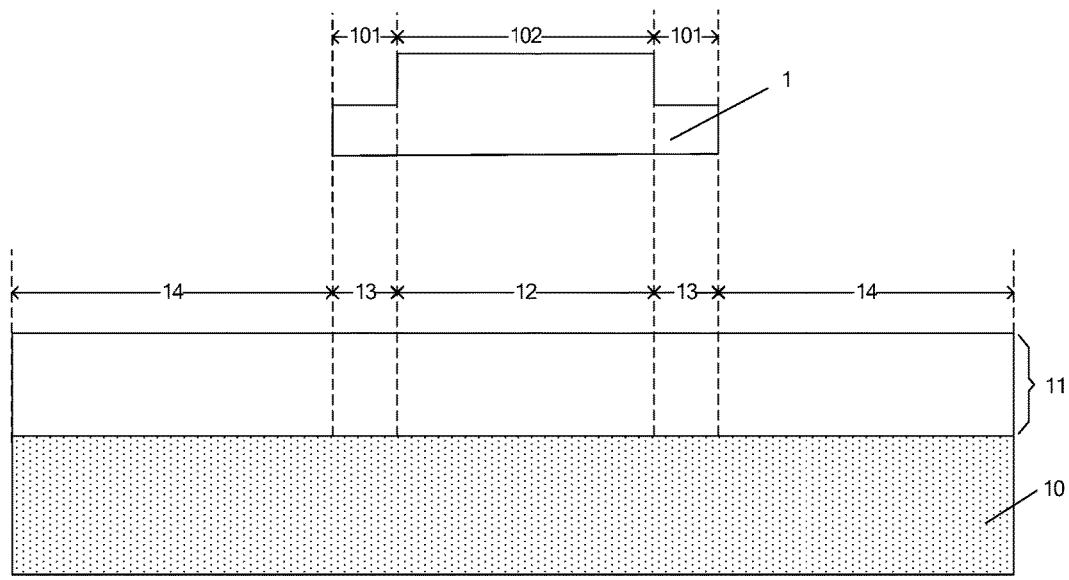
FIG. 6 is a schematic view illustrating the correspondence between the negative photoresist and the mask pattern.

It is to be noted that to distinguish the different portions of the negative photoresist, a portion of the negative photoresist which needs to be fully cured is referred to as the fully-cured portion, a portion of the negative photoresist which needs to be partially cured is referred to as the semi-cured portion, and a portion of the negative photoresist which needs to be removed is referred to as the removed portion. The positional relationships among the fully-cured portion, the semi-cured portion and the removed portion are not restricted in the present disclosure, but can be determined by the mask pattern which is to be formed. The fully-cured portion can be corresponding to a thicker portion in the mask pattern, the semi-cured portion can be corresponding to a thinner portion in the mask pattern, and the removed portion can be corresponding to a portion which is to be removed. For example, if the mask pattern 1 having a step as illustrated in FIG. 1 is to be formed, referring to FIG. 6, the semi-cured portion 13 of the negative photoresist 11 can be corresponding to the step portion 101 of the mask pattern 1, and the fully-cured portion 12 can be corresponding to the body portion 102 adjacent to the step portion 101. That is to say, the semi-cured portion can be positioned between the fully-cured portion and the removed portion and adjacent to the fully-cured portion. Thus, a mask pattern having a step can be formed. Since the mask pattern having a step has many application occasions, forming the mask pattern having a step is taken as an example in the present disclosure and the drawings.

In an environment with oxygen, the negative photoresist as illustrated in FIG. 5 is subjected to a second exposure by use of a second ordinary mask plate, so that the semi-cured portion of the negative photoresist is exposed to light and the removed portion is not exposed to light. Thus, a structure as illustrated in FIG. 7 is obtained.

It is to be noted that, in the embodiments of the present disclosure, the method for performing the second exposure on the negative photoresist by use of the second ordinary mask plate is not restricted, as long as the semi-cured portion of the negative photoresist is exposed to light and the removed portion of the negative photoresist is not exposed to light. It is also to be noted that, in the second exposure, the fully-cured portion of the negative photoresist can be subjected to exposure once again, or alternatively, is not subjected to exposure, which is not restricted and depends on practical circumstances.

Figure 7:
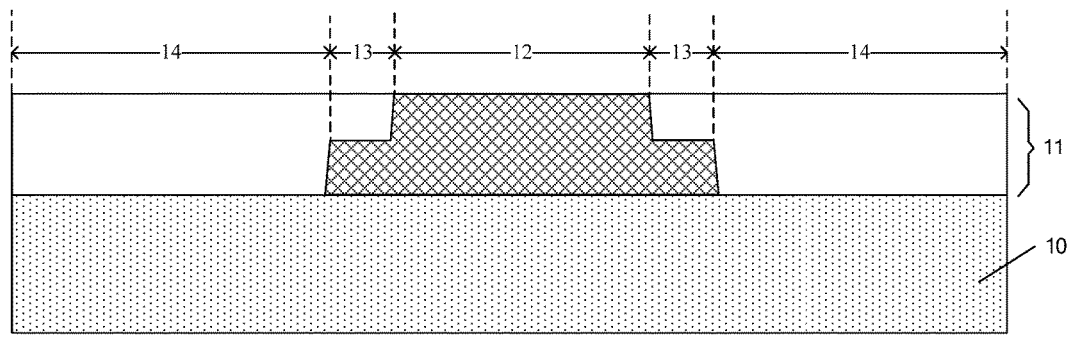
FIG. 7 is an illustrative view of the structure in FIG. 5 after a second exposure.

By removing the uncured negative photoresist 11 (i.e., the removed portion 14) as illustrated in FIG. 7, the mask pattern of FIG. 1 is formed.

In the embodiments of the present disclosure, the method for removing the uncured negative photoresist is not restricted. By way of example, the uncured negative photoresist can be removed by developing solution.

The embodiments of the present disclosure provide a method for forming a mask pattern, in which the negative photoresist is subjected to the first exposure by use of the first ordinary mask plate in an environment without oxygen so that the fully-cured portion of the negative photoresist is exposed to light and the semi-cured portion and the removed portion are not exposed to light, and then the negative photoresist is subjected to the second exposure by use of the second ordinary mask plate in an environment with oxygen so that the semi-cured portion of the negative photoresist is exposed to light and the removed portion is not exposed to light, and finally the uncured negative photoresist is removed and thus the mask pattern is formed, by utilizing the properties of the negative photoresist, i.e., the negative photoresist can be properly cured if exposed in an environment without oxygen, while the surface part of the negative photoresist cannot be properly cured and other part of the exposed portion can be properly cured if exposed in an environment with oxygen. The mask pattern comprises a pattern formed by the fully-cured portion and a pattern formed by the semi-cured portion. The pattern formed by the semi-cured portion has a smaller thickness than the pattern formed by the fully-cured portion. The method for forming the mask pattern can form a mask pattern having a non-uniform thickness only by using an ordinary mask plate, thereby avoiding using a halftone mask plate.

Thin Film Transistor (TFT) plays an important role in Thin Film Transistor Liquid Crystal Display (TFT-LCD). In the manufacturing process of the thin film transistor, it is required to form a thin film pattern having a step. Therefore, the mask pattern having a step is widely used.

Figure 8:
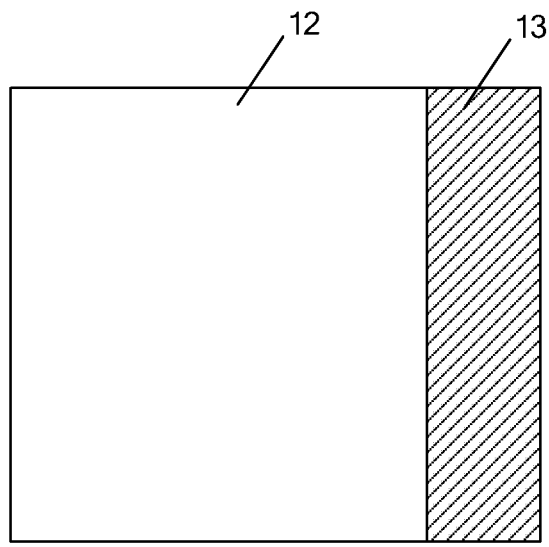
FIG. 8 is an illustrative structural view of a positional relationship between a fully-cured portion and a semi-cured portion in the negative photoresist according to one embodiment of the present disclosure.
Figure 9:
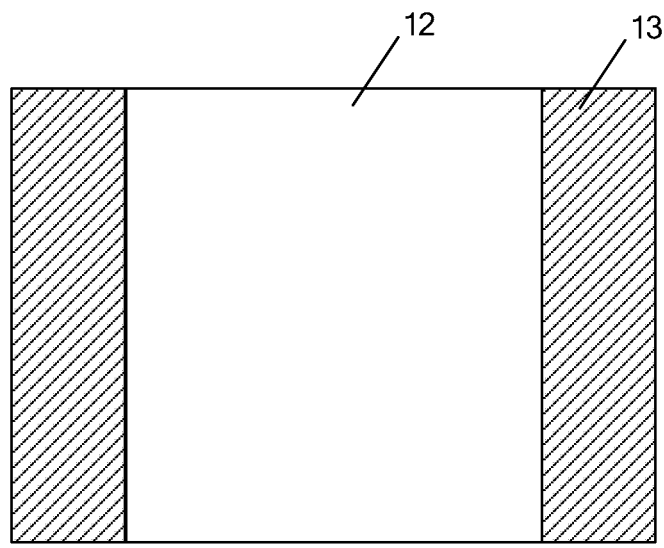
FIG. 9 is an illustrative structural view of a positional relationship between a fully-cured portion and a semi-cured portion in the negative photoresist according to another embodiment of the present disclosure.
Figure 10:
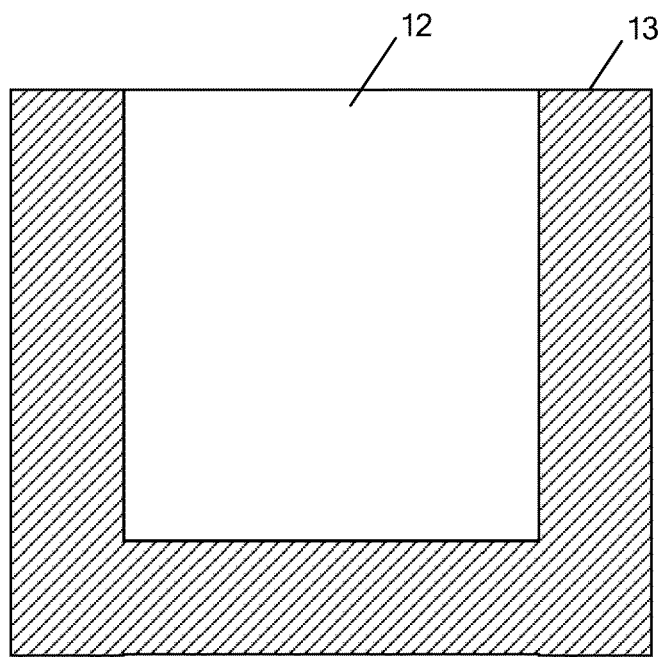
FIG. 10 is an illustrative structural view of a positional relationship between a fully-cured portion and a semi-cured portion in the negative photoresist according to yet another embodiment of the present disclosure.
Figure 11:
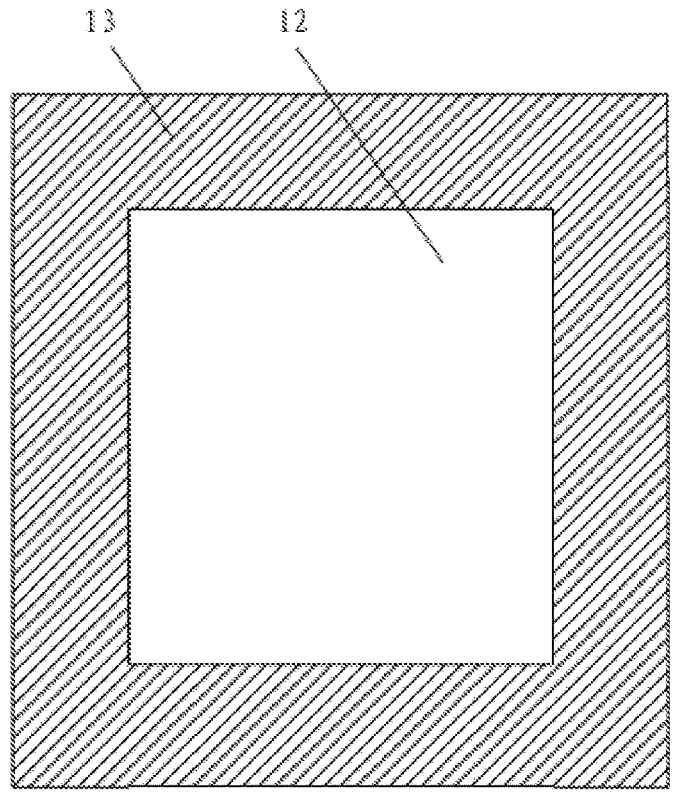
FIG. 11 is an illustrative structural view of a positional relationship between a fully-cured portion and a semi-cured portion in the negative photoresist according to still another embodiment of the present disclosure.

In one embodiment of the present disclosure, the semi-cured portion of the negative photoresist is positioned between the fully-cured portion and the removed portion and is adjacent to the fully-cured portion. Thus, a thin film pattern having a step can be formed. It is to be noted that the shapes of the fully-cured portion and the semi-cured portion are not restricted by the embodiments of the present disclosure, but can be determined by practical circumstances. By way of example, the fully-cured portion can be a cuboid, a cylinder or the like, and the semi-cured portion can be a rectangular ring, a circular ring, a cuboid and the like. When the TFT is manufactured, shapes of the portions except the step in the mask pattern are mostly cuboid. The embodiments of the present disclosure and the drawings are illustrated by taking the fully-cured portion of being a cuboid as an example. It is to be further noted that if the fully-cured portion is a cuboid, the semi-cured portion being adjacent to the fully-cured portion can be as illustrated in FIG. 8, in which the semi-cured portion 13 is adjacent to one side of the fully-cured portion 12, or can be as illustrated in FIG. 9, in which the semi-cured portion 13 is adjacent to two opposite sides of the fully-cured portion 12; or can be as illustrated in FIG. 10, in which the semi-cured portion 13 is adjacent to three sides of the fully-cured portion 12, or can be as illustrated in FIG. 11, in which the semi-cured portion 13 surrounds the fully-cured portion 12, which is not restricted here and can be determined by practical requirements. The embodiments of the present disclosure and the drawings are illustrated by taking the fully-cured portion and the semi-cured portion both being cuboids and the semi-cured portion being adjacent to the two opposite sides of the fully-cured portion as an example.

If the semi-cured portion of the negative photoresist is positioned between the fully-cured portion and the removed portion and is adjacent to the fully-cured portion, i.e., if the mask pattern having a step as illustrated in FIG. 1 is to be formed, the step of performing the second exposure on the negative photoresist by use of the second ordinary mask plate in an environment with oxygen so that the semi-cured portion of the negative photoresist is exposed to light and the removed portion of the negative photoresist is not exposed to light can be implemented by two methods, which will be discussed in detail below.

In one embodiment of the present disclosure, the second ordinary mask plate and the first ordinary mask plate are the same mask plate. Performing the second exposure on the negative photoresist by use of the second ordinary mask plate in an environment with oxygen so that the semi-cured portion of the negative photoresist is exposed to light and the removed portion of the negative photoresist is not exposed to light comprises:

in an environment with oxygen, keeping the corresponding positional relationship between the first ordinary mask plate and the negative photoresist and adjusting the exposure parameters, performing the second exposure on the negative photoresist by use of the first ordinary mask plate so that the semi-cured portion of the negative photoresist is exposed to light and the removed portion of the negative photoresist is not exposed to light.

It is to be noted that in the step of keeping the corresponding positional relationship between the first ordinary mask plate and the negative photoresist after performing the first exposure on the negative photoresist by use of the first ordinary mask plate, the corresponding positional relationship between the first ordinary mask plate and the negative photoresist refers to the corresponding positional relationships between the transparent part and the opaque part of the first ordinary mask plate and the fully-cured portion, the semi-cured portion and the removed portion of the negative photoresist. For example, in the second exposure and the first exposure, the transparent part of the first ordinary mask plate is always corresponding to the fully-cured portion of the negative photoresist and the opaque part of the first ordinary mask plate is always corresponding to the semi-cured portion and the removed portion of the negative photoresist. Thus, the corresponding positional relationship between the first ordinary mask plate and the negative photoresist is unchanged in the two successive exposures. The mask pattern having a step can be formed only by using an ordinary mask plate, and thus the production time is greatly saved and the production cost is significantly reduced, compared with the conventional art in which the mask pattern having a step is formed by the halftone mask plate.

The method for adjusting the exposure parameters is not restricted in the embodiments of the present disclosure. In one embodiment of the present disclosure, adjusting the exposure parameters can comprise one of adjusting an angle of the light emitted from the exposure machine so as to increase a range of the negative photoresist being irradiated by the light, increasing an exposure amount, and increasing a distance between the mask plate and the substrate, or a combination thereof.

Exposing the semi-cured portion by use of the above-described method for adjusting the exposure parameters will be described hereinafter.

Figure 12:
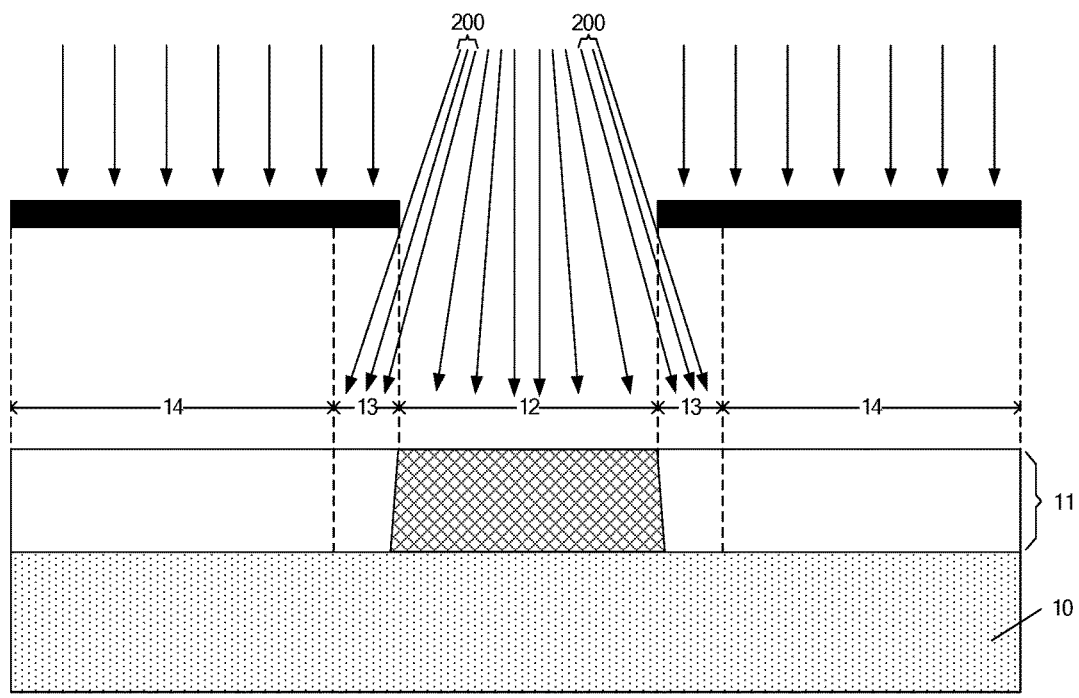
FIG. 12 is a schematic view of adjusting an angle of the light emitted from the exposure machine at the time of the second exposure in a step S03 in FIG. 2.

The semi-cured portion is exposed by adjusting an angle of the light emitted from the exposure machine. Referring to FIG. 12, the light path can changed in the method so that a part of the light 200 is directly irradiated onto the semi-cured portion and thus the semi-cured portion is exposed.

The semi-cured portion is exposed by increasing an exposure amount. When the light is irradiated onto the mask plate, a portion of the light beam will be diffracted at the boundaries between the transparent part and the opaque part of the mask plate, so that the portion of the light beam is irradiated onto the semi-cured portion. But in practice there is a very small amount of diffracted light beam. Therefore, it is necessary to increase the exposure amount so as to increase the amount of diffracted light beam, so that a sufficient amount of light beam is irradiated onto the semi-cured portion by diffraction and thus the semi-cured portion is exposed.

The distance between the mask plate and the substrate is increased. If the distance between the mask plate and the substrate is short, a small range of the semi-cured portion will be irradiated by the diffracted light. And it is not sufficient to irradiate the whole semi-cured portion through the diffracted light. Therefore, by increasing the distance between the mask plate and the substrate, the range of the semi-cured portion irradiated by the diffracted light can be enlarged so that the semi-cured portion is exposed.

All of the three aforementioned methods can make the semi-cured portion of the negative photoresist exposed and the removed portion of the negative photoresist unexposed. Only one of the methods can be employed or an arbitrary combination of the methods can be employed, which is not restricted herein.

In one embodiment of the present disclosure, the aforementioned increasing an exposure amount comprises increasing exposure time and/or increasing illuminance of the exposure machine. That is to say, the exposure amount can be increased by increasing the exposure time only or by increasing the illuminance of the exposure machine only or by increasing both the exposure time and the illuminance of the exposure machine simultaneously, which is not restricted here and can be determined by practical circumstances.

In one optional embodiment of the present disclosure, in an environment with oxygen, the negative photoresist being subjected to the second exposure by use of the second ordinary mask plate so that the semi-cured portion of the negative photoresist is exposed to light and the removed portion is not exposed to light comprises:

in an environment with oxygen, the negative photoresist being subjected to the second exposure by use of the second ordinary mask plate, so that the semi-cured portion of the negative photoresist is exposed to light and the removed portion is not exposed to light, wherein the second ordinary mask plate and the first ordinary mask plate are different from each other.

Figure 13:
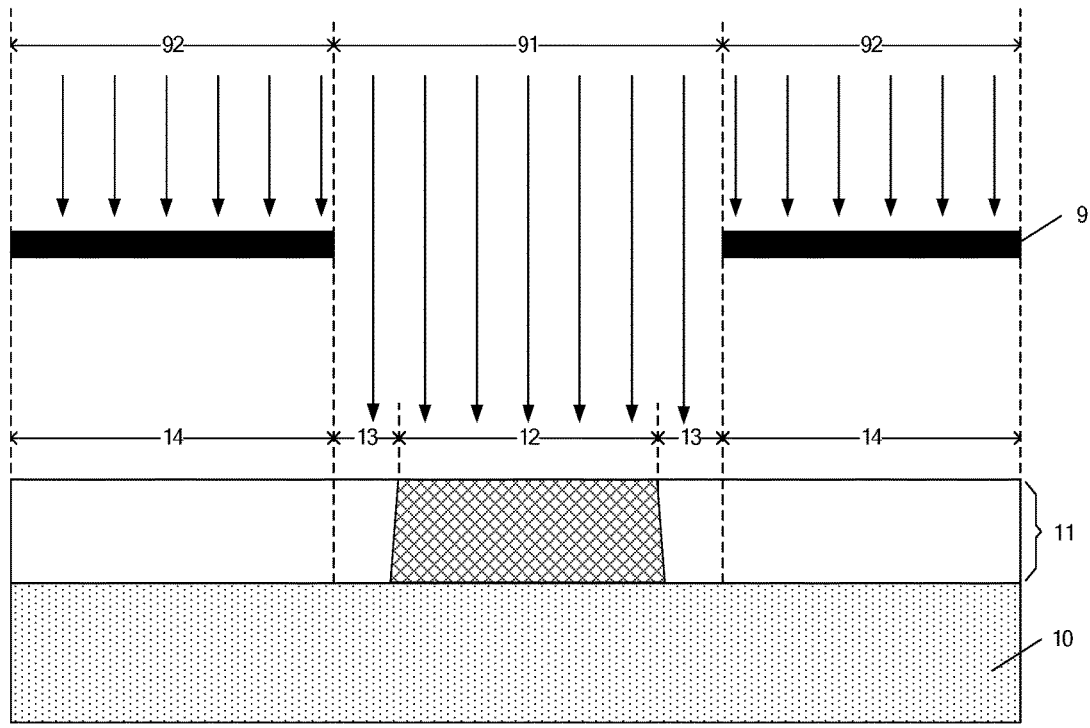
FIG. 13 is an illustrative view of performing exposure by use of a second mask plate at the time of the second exposure in a step S03 in FIG. 2.

Herein, it is to be noted that, after the negative photoresist is subjected to the first exposure by use of the first ordinary mask plate, referring to FIG. 13, the negative photoresist as illustrated in FIG. 5 is subjected to the second exposure by use of the second ordinary mask plate, wherein a transparent part 91 of the second ordinary mask plate 9 can be corresponding to the fully-cured portion 12 and the semi-cured portion 13 of the negative photoresist 11, and an opaque part 92 of the second ordinary mask plate 9 can be corresponding to the removed portion 14 of the negative photoresist 11. Thus, when the ultraviolet light is irradiated onto the second ordinary mask plate 9, it can be achieved that the semi-cured portion 13 is exposed to light and the removed portion 14 is not exposed to light.

Compared with the second method, the first method just requires one ordinary mask plate and thus can save production time and reduce production cost.

In one embodiment of the present disclosure, the environment without oxygen in which the negative photoresist 11 is subjected to the first exposure by use of the first ordinary mask plate 8 can be a vacuum environment or an inert gas environment, wherein the inert gas can be helium gas, argon gas, neon gas, and etc., which is not restricted herein.

In one embodiment of the present disclosure, forming a negative photoresist on the substrate comprises coating a negative photoresist on the substrate or forming a negative photoresist on the substrate by a transfer method, which is simple and easy to implement.

Embodiment Two

Figure 14:
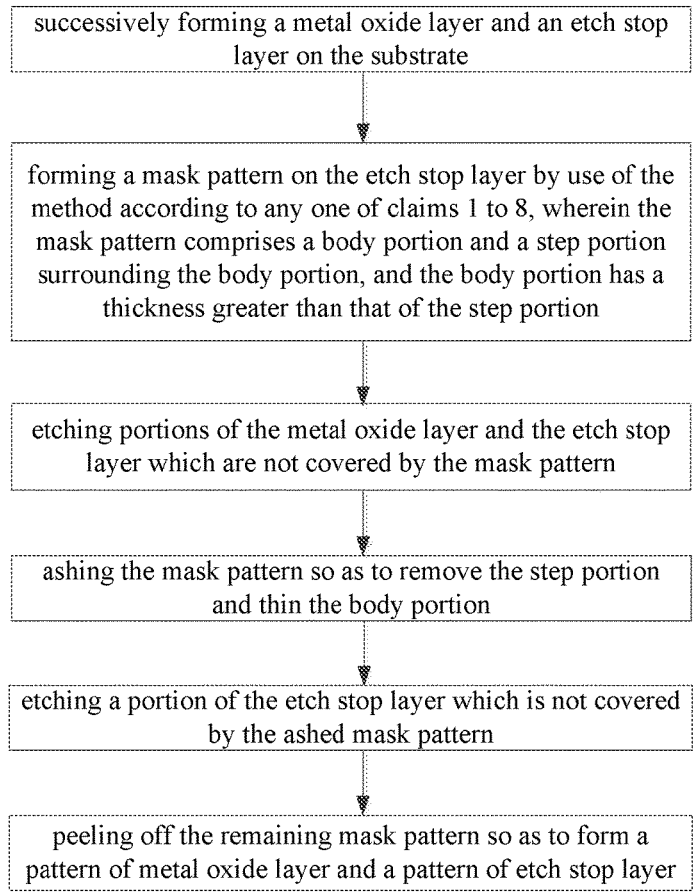
FIG. 14 is an illustrative flow chart of a method for forming a thin film transistor according to one embodiment of the present disclosure.
Figure 15:
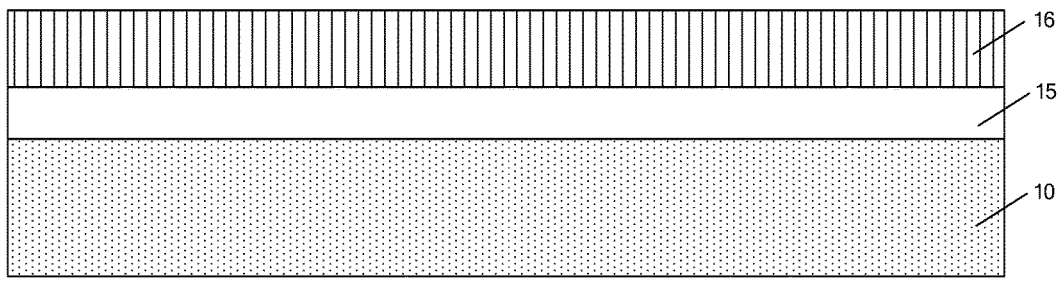
FIG. 15 is an illustrative view of a corresponding structure formed after the step S141 in FIG. 14.

At least one embodiment of the present disclosure provides a method for forming a thin film transistor. Referring to FIG. 14, the method comprises:

successively forming a metal oxide layer 15 and an etch stop layer 16 on the substrate 10. The thus-formed structure is illustrated in FIG. 15.

The material for the metal oxide layer can be indium gallium zinc oxide (IGZO), indium tin zinc oxide (ITZO), zinc indium tin oxide (ZITO) or magnesium indium zinc oxide (MgIZO) and the like, which is not restricted herein. The material for the etch stop layer can be silicon nitride, silicon oxide or silicon nitrogen oxide and the like. Thicknesses of the metal oxide layer and the etch stop layer are not restricted by the embodiments of the present embodiments.

The methods for forming the metal oxide layer and the etch stop layer are not restricted by the embodiments of the present disclosure. By way of example, the metal oxide layer and the etch stop layer can be deposited onto the substrate by sputtering or thermal evaporation.

Figure 16:
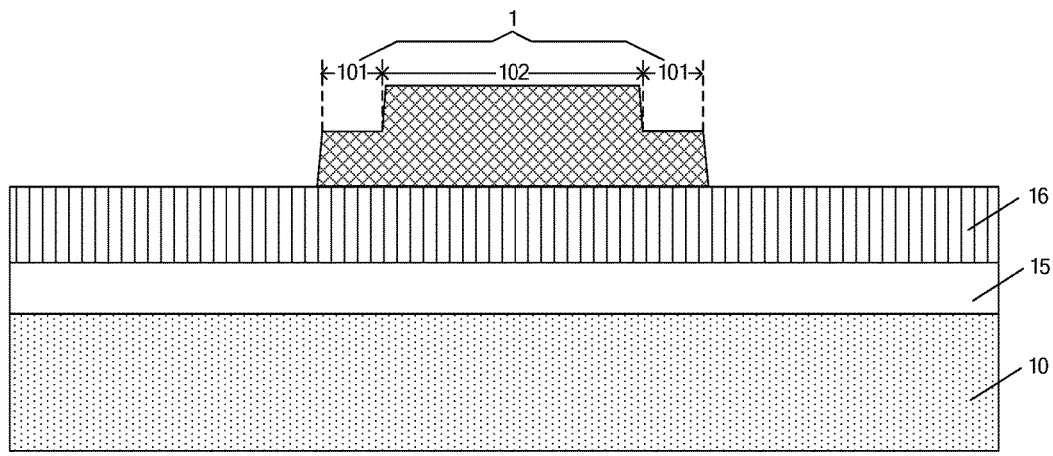
FIG. 16 is an illustrative view of a corresponding structure formed after the step S142 in FIG. 14.

A mask pattern 1 is formed on the etch stop layer 16 by the above-described method for forming a mask pattern. The mask pattern 1 comprises the body portion 102 and the step portion 101 surrounding the body portion 102. The thickness of the body portion 102 is greater than that of the step portion 101. The thus-formed structure is illustrated in FIG. 16.

For example, the body portion and the step portion of the mask pattern can be the fully-cured portion and the semi-cured portion, respectively, of the negative photoresist in the mask pattern formed by the above-described method for forming a mask pattern. Please refer to the above-described method for forming a mask pattern for the forming process of the mask pattern, which will be not elaborated here.

Figure 17:
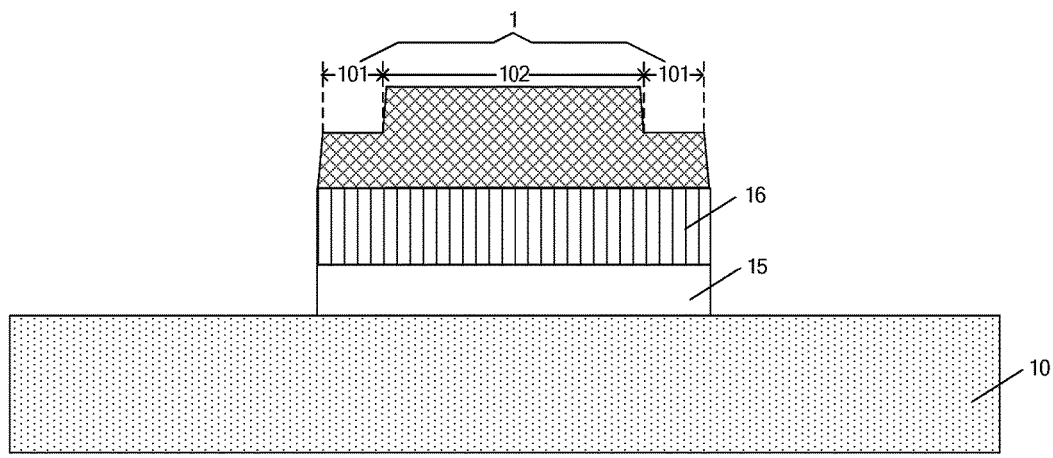
FIG. 17 is an illustrative view of a corresponding structure formed after the step S143 in FIG. 14.

Portions of the metal oxide layer 15 and the etch stop layer 16 which are not covered by the mask pattern 1 are etched, thereby forming a structure as illustrated in FIG. 17.

Portions of the metal oxide layer 15 and the etch stop layer 16 which are not covered by the mask pattern 1 can be etched through dry-etching or wet-etching and the like, which is not restricted in the embodiments of the present disclosure.

Figure 18:
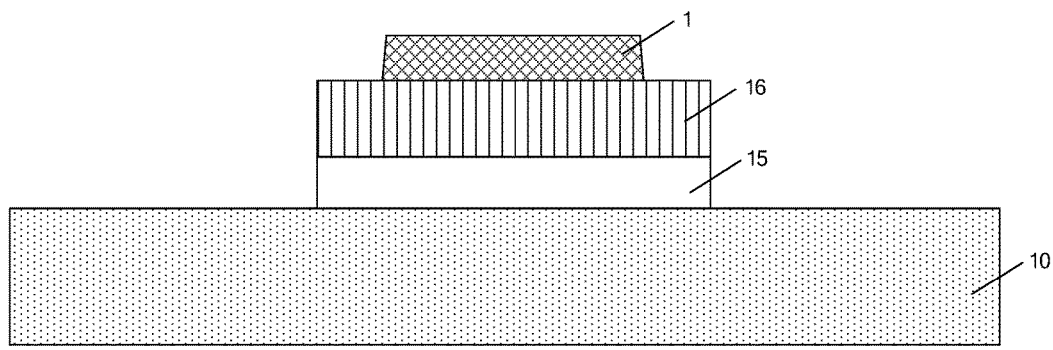
FIG. 18 is an illustrative view of a corresponding structure formed after the step S144 in FIG. 14.

The mask pattern 1 as illustrated in FIG. 17 is ashed so that the step portion 101 is removed and the body portion 102 is thinned, thereby forming a structure as illustrated in FIG. 18.

Figure 19:
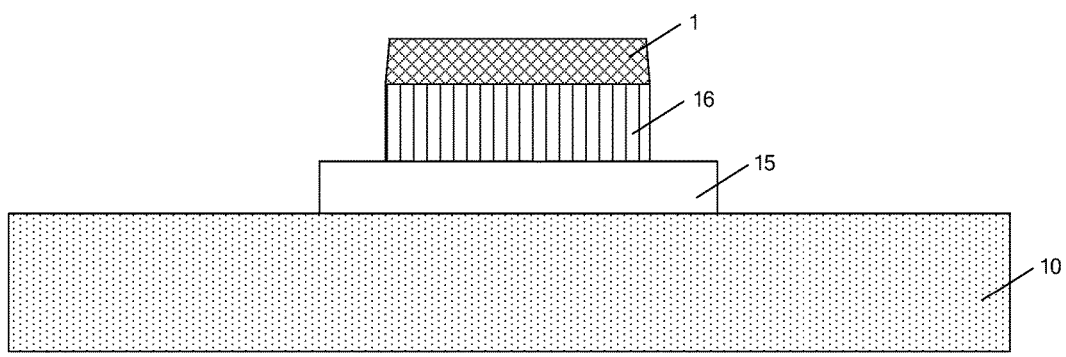
FIG. 19 is an illustrative view of a corresponding structure formed after the step S145 in FIG. 14.

A portion of the etch stop layer 16 which is not covered by the mask pattern 1 after ashed as illustrated in FIG. 18 is etched, thereby forming a structure as illustrated in FIG. 19.

The remaining mask pattern 1 as illustrated in FIG. 19 is peeled off so as to form a pattern of metal oxide layer 150 and a pattern of etch stop layer 160. The thus-formed structure is illustrated in FIG. 20.

Figure 20:
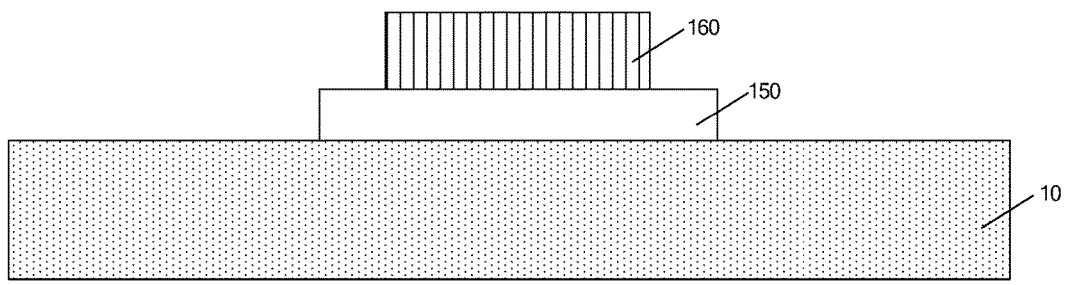
FIG. 20 is an illustrative view of a corresponding structure formed after the step S146 in FIG. 14.

In FIG. 20, steps are formed at the edges of the pattern of metal oxide layer 150 and the pattern of etch stop layer 160. Such a structure is called a Side Wing Contact (SWC) structure. After such a structure is formed, source and drain electrodes can be formed on the pattern.

It is to be noted that only the method for forming a structure in the thin film transistor which is related to the inventive concept has been described in detail in the embodiments of the present disclosure. It would be appreciated by those skilled in the art that the thin film transistor can further comprise other components, for example, can further comprise a gate metal layer, a gate insulating layer, and a source and drain metal layer. In this case, a method for forming a thin film transistor can further comprise forming a gate electrode, a gate insulating layer, and source and drain electrodes and the like on the substrate, which is not elaborated herein.

A metal oxide thin film transistor can be formed by the above-described method. The thin film transistor has very high mobility and fast response, and is widely used in display devices such as cell phones and tablet computers.

Optionally, the material for the metal oxide layer can be indium gallium zinc oxide, indium tin zinc oxide, zinc indium tin oxide or magnesium indium zinc oxide.

Embodiment Three

Figure 21:
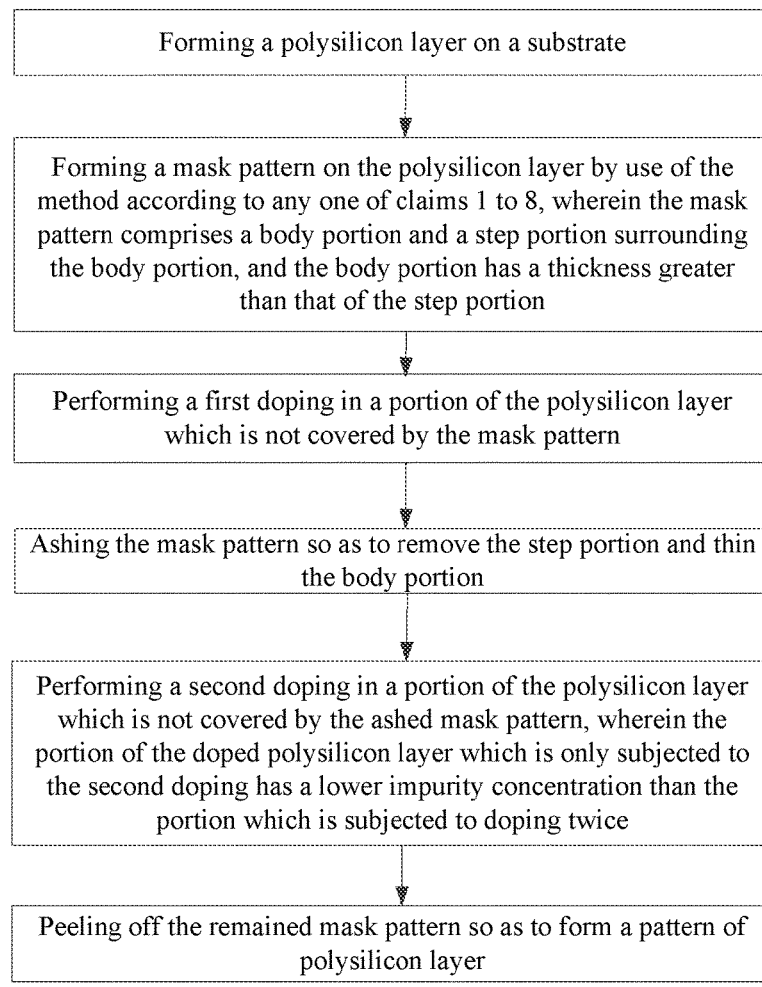
FIG. 21 is an illustrative flow chart of a method for forming a thin film transistor according to another embodiment of the present disclosure.
Figure 22:
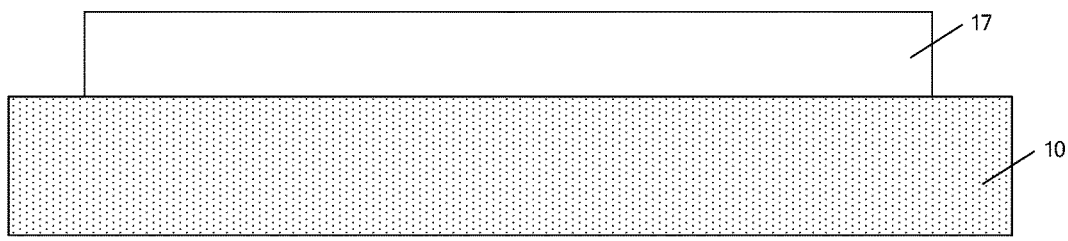
FIG. 22 is an illustrative view of a corresponding structure formed after the step S211 in FIG. 21.

At least one embodiment of the present disclosure provides a method for forming a thin film transistor. Referring to FIG. 21, the method comprises:

forming a polysilicon layer 17 on the substrate 10. The thus-formed structure is illustrated in FIG. 22.

For example, an amorphous silicon layer can be formed on the substrate and then is treated by excimer laser annealing method so that the amorphous silicon layer is converted into a polysilicon layer. The method for forming the polysilicon layer is not restricted in the embodiments of the present disclosure.

The mask pattern 1 is formed on the polysilicon layer 17 through any one of the above-described methods for forming a mask pattern. The mask pattern 1 comprises the body portion 102 and the step portion 101 surrounding the body portion 102. The thickness of the body portion 102 is greater than that of the step portion 101. The thus-formed structure is illustrated in FIG. 23.

For example, the body portion and the step portion of the mask pattern can be the fully-cured portion and the semi-cured portion, respectively, of the negative photoresist in the mask pattern formed by the above-described method for forming a mask pattern. Please refer to the above-described method for forming a mask pattern for the forming process of the mask pattern, which will not be elaborated herein.

Figure 23:
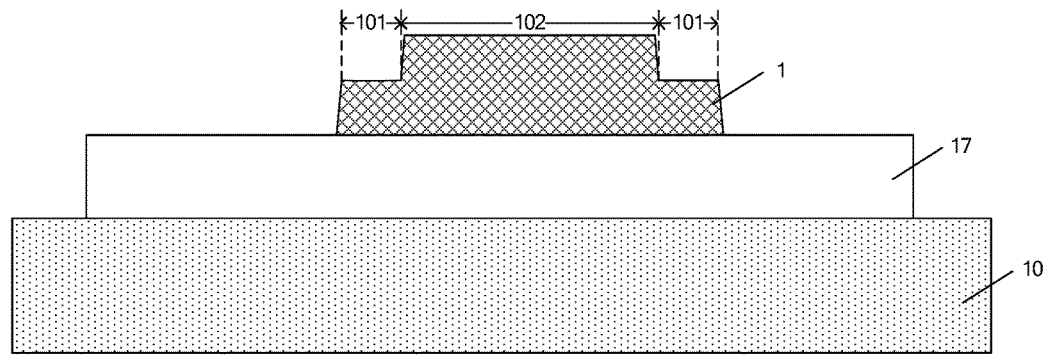
FIG. 23 is an illustrative view of a corresponding structure formed after the step S212 in FIG. 21.
Figure 24:
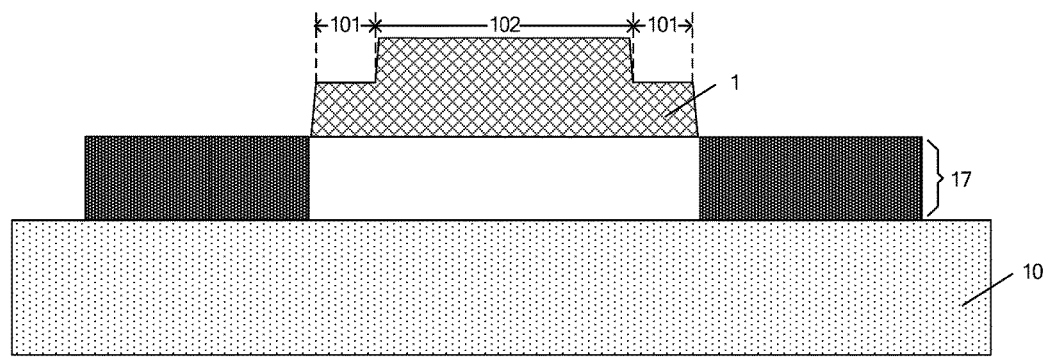
FIG. 24 is an illustrative view of a corresponding structure formed after the step S213 in FIG. 21.

A portion of the polysilicon layer 17 which is not covered by the mask pattern 1 as illustrated in FIG. 23 is subjected to a first doping, thereby forming a structure as illustrated in FIG. 24.

Figure 25:
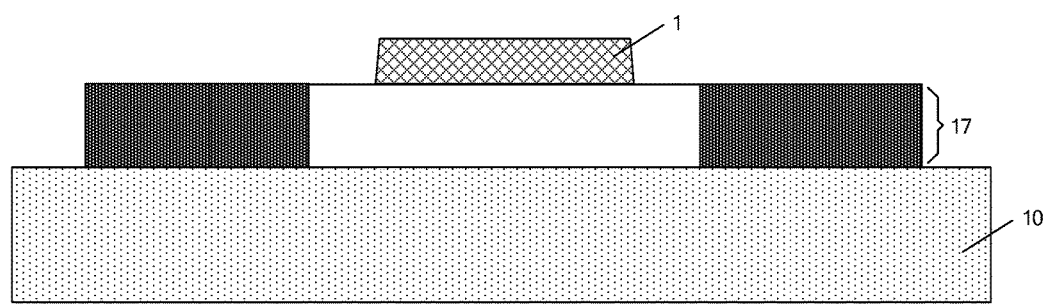
FIG. 25 is an illustrative view of a corresponding structure formed after the step S214 in FIG. 21.

The mask pattern 1 as illustrated in FIG. 24 is ashed so that the step portion 101 is removed and the body portion 102 is thinned, thereby forming a structure as illustrated in FIG. 25.

Figure 26:
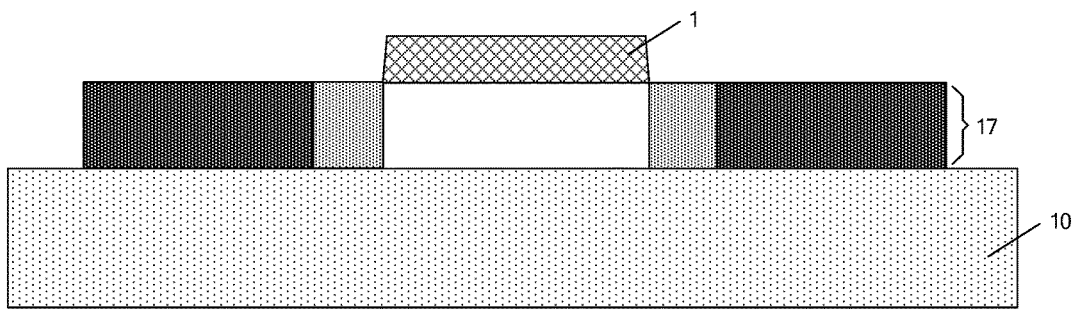
FIG. 26 is an illustrative view of a corresponding structure formed after the step S215 in FIG. 21.

A portion of the polysilicon layer 17 which is not covered by the mask pattern 1 after ashed as illustrated in FIG. 25 is subjected to a second doping, thereby forming a structure as illustrated in FIG. 26. The portion of the polysilicon layer which is only subjected to the second doping has a lower impurity concentration than the portion which is subjected to the first doping and the second doping.

It is to be noted that those skilled in the art usually refer to the first doping as heavy doping, and the second doping as light doping. The impurity concentration after the heavy doping is higher than the impurity concentration after the light doping.

Figure 27:
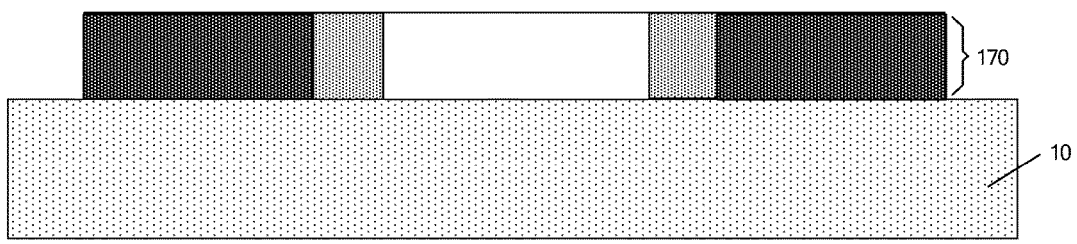
FIG. 27 is an illustrative view of a corresponding structure formed after the step S216 in FIG. 21.

The remaining mask pattern 1 as illustrated in FIG. 26 is peeled off so as to form a pattern of polysilicon layer 170 as illustrated in FIG. 27.

It is to be noted that only the method for forming a structure in the thin film transistor which is related to the inventive concept has been described in detail in the embodiments of the present disclosure. It would be appreciated by those skilled in the art that the thin film transistor can further comprise other components, for example, can further comprise a gate metal layer, a gate insulating layer, and a source and drain metal layer. In this case, a method for forming a thin film transistor can further comprise forming a gate electrode, a gate insulating layer, and source and drain electrodes and the like on the substrate, which will be not elaborated herein.

The Low Temperature Poly-Silicon (LTPS) thin film transistor can be formed through the above-described method. The thin film transistor has properties of high mobility and fast response, and is widely used in display devices such as cell phones and tablet computers.

Figure 28:
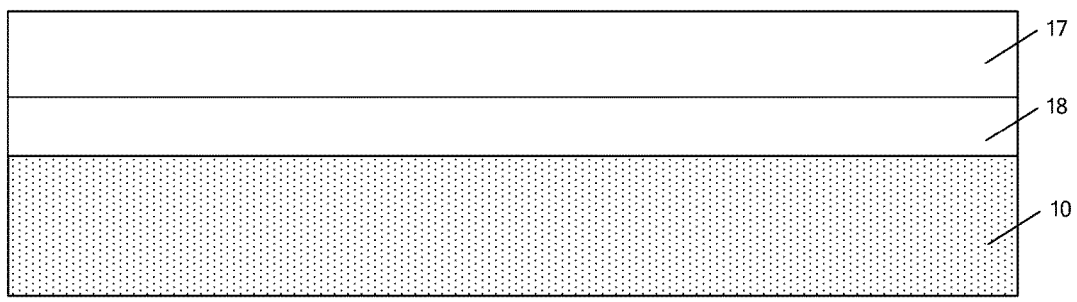
FIG. 28 is an illustrative structural view of a buffer layer formed between the substrate and the polysilicon layer in FIG. 22.

In one embodiment of the present disclosure, before forming the polysilicon layer 17 on the substrate 10, the method further comprises forming a buffer layer 18 on the substrate 10. The buffer layer 18 is disposed between the substrate 10 and the polysilicon layer 17. The buffer layer can enhance the adherence between the polysilicon layer and the substrate. The thus-formed structure is illustrated in FIG. 28.

Embodiment Four

At least one embodiment of the present disclosure provides a thin film transistor which can be formed through any one of the above-described methods for forming a thin film transistor and can also be formed through any one of the methods for forming a thin film transistor provided in Embodiment Three. The former is a metal oxide thin film transistor and the latter is a polysilicon thin film transistor, and both of the two thin film transistors are widely used in the display technical field.

Embodiment Five

At least one embodiment of the present disclosure provides a display device comprising the thin film transistor according to any one of those provided by Embodiment Four. The display device can be a display element such as a liquid crystal display, an electronic paper, an OLED (Organic Light-Emitting Diode) display and the like, or can be any product or component having the display function and including the display element, such as a television, a digital camera, a cell phone, a tablet computer and the like.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610004474.2 filed on Jan. 4, 2016, the disclosure of which is hereby entirely incorporated by reference as a part of the present disclosure.

The invention claimed is:

1. A method for forming a mask pattern, comprising:
forming a negative photoresist on a substrate, the negative photoresist having the following properties: after the negative photoresist is exposed in an environment without oxygen, an exposed portion is cured; after the negative photoresist is exposed in an environment with oxygen, a surface part of an exposed portion is not cured, while other part of the exposed portion than the surface part is cured;
in an environment without oxygen, performing a first exposure on the negative photoresist by use of a first ordinary mask plate, so that a fully-cured portion of the negative photoresist is exposed to light and a semi-cured portion and a removed portion of the negative photoresist are not exposed to light;
in an environment with oxygen, performing a second exposure on the negative photoresist with s second ordinary mask plate, so that the semi-cured portion of the negative photoresist is exposed to light and the removed portion of the negative photoresist is not exposed to light; and
removing the uncured negative photoresist and forming the mask pattern.

2. The method according to claim 1, wherein the semi-cured portion of the negative photoresist is positioned between the fully-cured portion and the removed portion and is adjacent to the fully-cured portion.

3. The method according to claim 2, wherein the second ordinary mask plate and the first ordinary mask plate are the same ordinary mask plate;
in an environment with oxygen, performing a second exposure on the negative photoresist by use of a second ordinary mask, so that the semi-cured portion of the negative photoresist is exposed to light and the removed portion of the negative photoresist is not exposed to light comprises:
in an environment with oxygen, keeping corresponding positional relationship between the first ordinary mask plate and the negative photoresist and adjusting exposure parameters, performing the second exposure on the negative photoresist by use of the first ordinary mask plate so that the semi-cured portion of the negative photoresist is exposed to light and the removed portion of the negative photoresist is not exposed to light.

4. The method according to claim 3, wherein adjusting exposure parameters comprises:
one of adjusting an angle of light emitted from an exposure machine so as to increase a range of the negative photoresist being irradiated by the light, increasing an exposure amount, and increasing a distance between the mask plate and the substrate, and a combination thereof.

5. The method according to claim 4, wherein increasing an exposure amount comprises:
increasing exposure time and/or increasing illuminance of the exposure machine.

6. The method according to claim 1, wherein the environment without oxygen is a vacuum environment or an inert gas environment.

7. The method according to claim 1, wherein in an environment with oxygen, performing a second exposure on the negative photoresist by use of a second ordinary mask plate, so that the semi-cured portion of the negative photoresist is exposed to light and the removed portion of the negative photoresist is not exposed to light comprises:
in an environment with oxygen, performing a second exposure on the negative photoresist by use of second ordinary mask plate, so that the semi-cured portion of the negative photoresist is exposed to light and the removed portion of the negative photoresist is not exposed to light.

8. The method according to claim 1, wherein forming a negative photoresist on a substrate comprises:
coating the negative photoresist on the substrate or forming the negative photoresist on the substrate by a transfer method.

9. A method for forming a thin film transistor, comprising:
successively forming a metal oxide layer and an etch stop layer on a substrate;
forming a mask pattern on the etch stop layer by use of the method according to claim 1, wherein the mask pattern comprises a body portion and a step portion surrounding the body portion, and the body portion has a thickness greater than that of the step portion;
etching portions of the metal oxide layer and the etch stop layer which are not covered by the mask pattern;
ashing the mask pattern so as to remove the step portion and thin the body portion;
etching a portion of the etch stop layer which is not covered by the ashed mask pattern;
peeling off the remaining mask pattern so as to form a pattern of metal oxide layer and a pattern of etch stop layer.

10. The method according to claim 9, wherein material for the metal oxide layer is indium gallium zinc oxide, indium tin zinc oxide, zinc indium tin oxide or magnesium indium zinc oxide.

11. A method for forming a thin film transistor, comprising:
 forming a polysilicon layer on a substrate;
 forming a mask pattern on the polysilicon layer by use of the method according to claim 1, wherein the mask pattern comprises a body portion and a step portion surrounding the body portion, and the body portion has a thickness greater than that of the step portion;
 performing a first doping in a portion of the polysilicon layer which is not covered by the mask pattern;
 ashing the mask pattern so as to remove the step portion and thin the body portion;
 performing a second doping in a portion of the polysilicon layer which is not covered by the ashed mask pattern, wherein the portion of the doped polysilicon layer which is only subjected to the second doping has a lower impurity concentration than the portion which is subjected to doping twice;
 peeling off the remained mask pattern so as to form a pattern of polysilicon layer.

12. The method according to claim 11, wherein before forming a polysilicon layer on a substrate, the method further comprises:
 forming a buffer layer on the substrate, the buffer layer being positioned between the substrate and the polysilicon layer.

13. The method according to claim 2, wherein in an environment with oxygen, performing a second exposure on the negative photoresist by use of a second ordinary mask plate, so that the semi-cured portion of the negative photoresist is exposed to light and the removed portion of the negative photoresist is not exposed to light comprises:
 in an environment with oxygen, performing a second exposure on the negative photoresist by use of second ordinary mask plate, so that the semi-cured portion of the negative photoresist is exposed to light and the removed portion of the negative photoresist is not exposed to light.

14. A method for forming a thin film transistor, comprising:
 successively forming a metal oxide layer and an etch stop layer on a substrate;
 forming a mask pattern on the etch stop layer by use of the method according to claim 2, wherein the mask pattern comprises a body portion and a step portion surrounding the body portion, and the body portion has a thickness greater than that of the step portion;
 etching portions of the metal oxide layer and the etch stop layer which are not covered by the mask pattern;
 ashing the mask pattern so as to remove the step portion and thin the body portion;
 etching a portion of the etch stop layer which is not covered by the ashed mask pattern;
 peeling off the remaining mask pattern so as to form a pattern of metal oxide layer and a pattern of etch stop layer.

15. The method according to claim 14, wherein before forming a polysilicon layer on a substrate, the method further comprises:
 forming a buffer layer on the substrate, the buffer layer being positioned between the substrate and the polysilicon layer.

16. A method for forming a thin film transistor, comprising:
 forming a polysilicon layer on a substrate;
 forming a mask pattern on the polysilicon layer by use of the method according to claim 2, wherein the mask pattern comprises a body portion and a step portion surrounding the body portion, and the body portion has a thickness greater than that of the step portion;
 performing a first doping in a portion of the polysilicon layer which is not covered by the mask pattern;
 ashing the mask pattern so as to remove the step portion and thin the body portion;
 performing a second doping in a portion of the polysilicon layer which is not covered by the ashed mask pattern, wherein the portion of the doped polysilicon layer which is only subjected to the second doping has a lower impurity concentration than the portion which is subjected to doping twice;
 peeling off the remained mask pattern so as to form a pattern of polysilicon layer.

17. The method according to claim 16, wherein before forming a polysilicon layer on a substrate, the method further comprises:
 forming a buffer layer on the substrate, the buffer layer being positioned between the substrate and the polysilicon layer.

* * * * *